United States Patent
Oyama et al.

(10) Patent No.: US 11,576,291 B2
(45) Date of Patent: Feb. 7, 2023

(54) COMPONENT MOUNTING MACHINE

(71) Applicant: FUJI CORPORATION, Chiryu (JP)

(72) Inventors: Shigeto Oyama, Kariya (JP); Jun Iisaka, Nisshin (JP); Michinaga Onishi, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 301 days.

(21) Appl. No.: 16/769,810

(22) PCT Filed: Dec. 15, 2017

(86) PCT No.: PCT/JP2017/045119
§ 371 (c)(1),
(2) Date: Jun. 4, 2020

(87) PCT Pub. No.: WO2019/116540
PCT Pub. Date: Jun. 20, 2019

(65) Prior Publication Data
US 2020/0375075 A1 Nov. 26, 2020

(51) Int. Cl.
*H05K 13/08* (2006.01)
*H05K 13/04* (2006.01)

(52) U.S. Cl.
CPC ..... *H05K 13/0818* (2018.08); *H05K 13/0406* (2018.08); *H05K 13/0812* (2018.08); *H05K 13/0815* (2018.08)

(58) Field of Classification Search
CPC ........... H05K 13/0818; H05K 13/0406; H05K 13/0812; H05K 13/0815
See application file for complete search history.

(56) References Cited

U.S. PATENT DOCUMENTS

| 10,582,651 | B2 * | 3/2020 | Kamio | H05K 13/0408 |
| 2002/0044432 | A1 * | 4/2002 | Nakano | H05K 13/089 361/760 |

(Continued)

FOREIGN PATENT DOCUMENTS

| EP | 2066166 A1 * | 6/2009 | ......... H05K 13/0452 |
| JP | 2001223499 A * | 8/2001 | |

(Continued)

OTHER PUBLICATIONS

International Search Report dated Feb. 27, 2018 in PCT/JP2017/045119 filed Dec. 15, 2017, 2 pages.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounting machine, including a component transfer device, having a component mounting tool configured to collect and mount a component, a mounting head configured to hold the component mounting tool, and a head driving mechanism configured to horizontally drive the mounting head, which performs a mounting work of mounting the component collected from a component supply device on a predetermined coordinate position of a board carried in and positioned by a board conveyance device, and a control device configured to control the mounting work, and configured to implement a thermal correction process for reducing an influence on mounting accuracy of the component, of which influence being caused by thermal deformation due to a temperature change in at least one of the head driving mechanism and the mounting head.

12 Claims, 7 Drawing Sheets

(56) References Cited

U.S. PATENT DOCUMENTS

| | | | |
|---|---|---|---|
| 2002/0101214 A1* | 8/2002 | Iisaka | H05K 13/0812 |
| | | | 361/135 |
| 2004/0188642 A1 | 9/2004 | Kodama et al. | |
| 2006/0048380 A1* | 3/2006 | Okuda | H05K 13/0812 |
| | | | 29/832 |
| 2017/0347506 A1* | 11/2017 | Kamio | H05K 13/0408 |

FOREIGN PATENT DOCUMENTS

| | | | | |
|---|---|---|---|---|
| JP | 2004-179636 A | | 6/2004 | |
| JP | 2012146907 A | * | 8/2012 | |
| WO | WO 2016/103413 A1 | | 6/2016 | |
| WO | WO-2016103413 A1 | * | 6/2016 | G05B 19/404 |
| WO | WO-2017119142 A1 | * | 7/2017 | G06T 7/248 |

\* cited by examiner

| PP CYCLE | COMPONENT TYPE | ACCURACY REQUIREMENT LEVEL S FOR EACH COMPONENT | ACCURACY REQUIREMENT LEVEL S FOR PP CYCLE |
|---|---|---|---|
| Cy1 | PA | SL | |
| | PA | SL | |
| | PA | SL | SH |
| | PB | (SH) | |
| Cy2 | PA | SL | |
| | PA | SL | |
| | PC | SL | SM |
| | PD | (SM) | |
| Cy3 | PA | (SL) | |
| | PA | SL | |
| | PC | SL | SL |
| | PC | SL | |

| THERMAL INFLUENCE LEVEL H / ACCURACY REQUIREMENT LEVEL S | H0 | H1 | H2 | H3 |
|---|---|---|---|---|
| SL | ○ | ○ | ○ | × |
| SM | ○ | ○ | × | × |
| SH | ○ | × | × | × |

COMPONENT MOUNTING MACHINE

TECHNICAL FIELD

The present specification relates to a component mounting machine configured to perform a mounting work of mounting a component on a board.

BACKGROUND ART

Examples of a board work machine configured to produce a board on which a large number of components are mounted include a solder printing machine, a component mounting machine, a reflow machine, a board inspection machine, and the like. It is common to configure a board production line by arranging these board work machines side by side. The component mounting machine includes a component transfer device. The component transfer device mounts a component collected from a component supply device to a predetermined coordinate position of the board carried-in and positioned by a board conveyance device. When an operation of the component transfer device continues, temperature of constituting members may rise, and such a constituting member is thermally deformed, thereby affecting mounting accuracy of the component. In order to reduce influence of the thermal deformation, a thermal correction process is performed. Patent Literature 1 discloses a technical example related to a thermal correction process of a component mounting machine.

The component mounting machine of Patent Literature 1 employs a temperature rank that represents a temperature rise value of the constituting members of a component transfer device in a stepwise manner, and after the mounting work is performed up to an allowable time corresponding to the temperature rank, the temperature rank is changed by the thermal correction process. Further, when the mounting work is interrupted, the thermal correction process is performed according to a stop duration time, so that the temperature rank is changed. Further, the thermal correction process is simultaneously performed by two sets of component transfer devices mounted on the component mounting machine. Accordingly, an implementation timing of the thermal correction process can be optimized with reducing a temporal loss of the thermal correction process, which suppresses lowering production efficiency.

PATENT LITERATURE

Patent Literature 1: WO2016/103413

BRIEF SUMMARY

Technical Problem

In a technique of Patent Literature 1, it is useful that a thermal correction process can be performed according to an amount by which the temperature has increased. However, mounting accuracy required for a component is not always the same, rather it depends on the size and the type of the component. In general, mounting accuracy for a minuscule component is strictly managed, while mounting accuracy for a large component is moderately managed. In this regards, in the technique of Patent Literature 1, the level of the mounting accuracy required for the component is not considered. Therefore, in case of the required mounting accuracy being high, the implementation timing of the thermal correction process may be delayed, which turns out an occurrence of the mounting position error, while in a case of the required mounting accuracy being low, the thermal correction process may be performed excessively, which turns out lowering production efficiency.

Further, the mounting accuracy may be discontinuously reduced during a change timing of an implementation state of the mounting work. For example, when a mounting head of a component transfer device is replaced and mounted, subsequent mounting accuracy may be significantly reduced due to individual differences in the mounting head and errors in reproducing an attachment state. In such a case, it is preferable that the thermal correction process is performed regardless of the change in the temperature rise value.

In the present specification, a problem to be solved is to provide a component mounting machine that can achieve both sufficient mounting accuracy and high production efficiency in consideration of a degree of influence on thermal deformation which is caused by a temperature rise of constituting members of a component transfer device and an implementation state change of the mounting work.

Solution to Problem

The present specification discloses a component mounting machine, including a component transfer device, having a component mounting tool configured to collect and mount a component, a mounting head configured to hold the component mounting tool, and a head driving mechanism configured to horizontally drive the mounting head, which performs a mounting work of mounting the component collected from a component supply device on a predetermined coordinate position of a board carried in and positioned by a board conveyance device, and a control device configured to control the mounting work, and configured to implement a thermal correction process for reducing an influence on mounting accuracy of the component, of which influence being caused by thermal deformation due to a temperature change in at least one of the head driving mechanism and the mounting head, wherein the control device further comprises: an implementation timing determination section configured to determine an implementation timing of the thermal correction process, based on a required level of the mounting accuracy or in consideration of a change timing in which an implementation state of the mounting work changes with the mounting accuracy, and a thermal correction implementation section configured to implement the thermal correction process according to a determination result of the implementation timing determination section.

Advantageous Effects

In the component mounting machine disclosed in the present specification, the implementation timing determination section determines an implementation timing of a thermal correction process based on the level of required mounting accuracy or in consideration of a change timing in which an implementation state of a mounting work is changed, and thermal correction implementation section implements the thermal correction process according to the determination result. Accordingly, a degree of influence of the allowable thermal deformation is considered based on the required level of the mounting accuracy, so that the implementation timing of the thermal correction process is optimized. Alternatively, the thermal correction process is implemented as needed in consideration of the risk of lowering the mounting accuracy discontinuously due to the implementation state change of the mounting work. Therefore, sufficient mounting accuracy that is sufficient for the required mounting accuracy can be obtained. Further, the number of times of implementations of the thermal correction process is minimized, so that high production efficiency can be achieved.

DESCRIPTION OF EMBODIMENTS

1. Configuration of Component Mounting Machine 1 of First Embodiment

Figure 1:
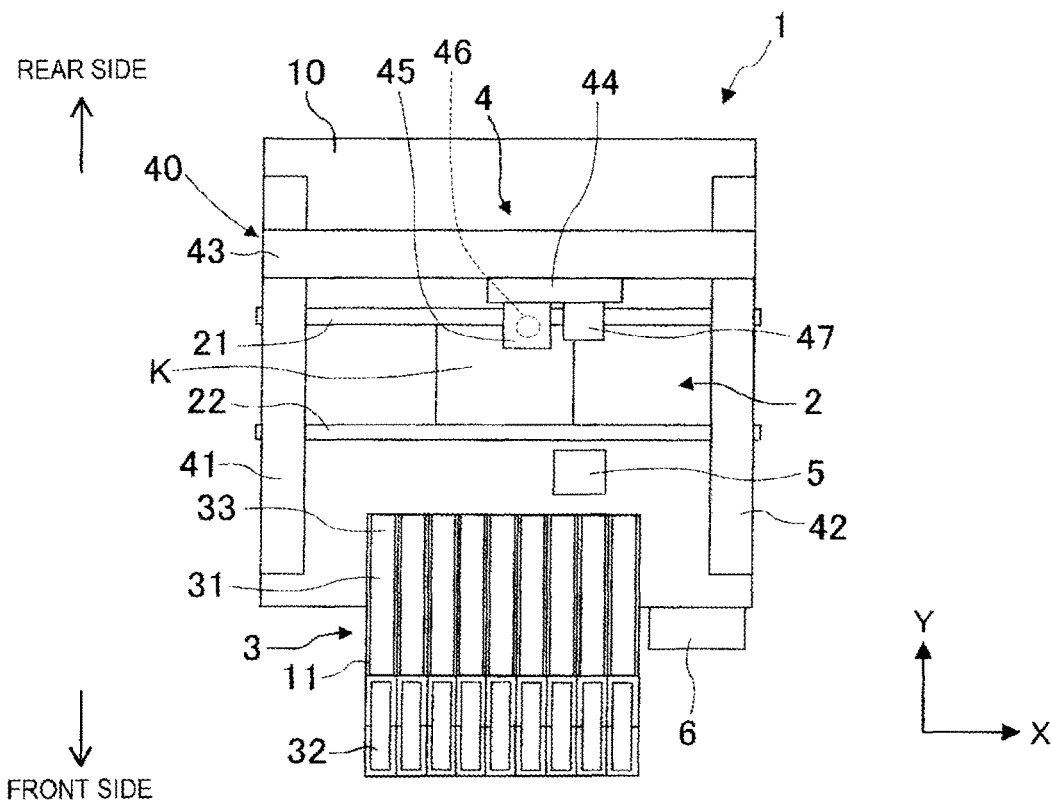
FIG. 1 is a plan view schematically illustrating a configuration of a component mounting machine according to a first embodiment.

Component mounting machine 1 according to a first embodiment will be described with reference to FIGS. 1 to 6. FIG. 1 is a plan view schematically illustrating a configuration of component mounting machine 1 according to the first embodiment. A direction from the left side to the right side of the drawing in FIG. 1 is an X-axis direction in which board K is conveyed, and a direction from the bottom side to the top side of the drawing is a Y-axis direction (front-rear direction). Component mounting machine 1 is configured by assembling board conveyance device 2, multiple feeder devices 3 corresponding to component supply devices, component transfer device 4, part camera 5, control device 6, and the like to machine stand 10. Board conveyance device 2, each feeder device 3, Component transfer device 4, and part camera 5 are controlled by control device 6, and each perform a predetermined operation.

Board conveyance device 2 includes pair of guide rails 21 and 22, a pair of conveyor belts, a board clamping mechanism, and the like. In a state in which board K is placed on the conveyor belts, the conveyor belts rotate along guide rails 21 and 22 to carry board K into a mounting implementation position. The board clamping mechanism pushes up, clamps, and positions board K at the mounting implementation position.

Multiple feeder devices 3 are mounted side by side on pallet stand 11 on the upper surface of machine stand 10. Each feeder device 3 holds tape reel 32 on the front side of main body portion 31. Supply position 33 is set at an upper portion near the rear side of main body portion 31. A carrier tape in which components are accommodated in multiple cavity portions is wound on tape reel 32. A tape feeding mechanism (not illustrated) pulls out the carrier tape from tape reel 32 and feeds the carrier tape to supply position 33. Accordingly, each feeder device 3 supplies a component at a respective supply position 33.

Component transfer device 4 is an XY robot type device that can horizontally move in the X-axis direction and the Y-axis direction. Component transfer device 4 includes head driving mechanism 40, mounting head 44, nozzle tool 45, suction nozzle 46, board camera 47, and the like. Head driving mechanism 40 includes pair of Y-axis rails 41 and 42, Y-axis slider 43, and a driving motor that is not illustrated. Y-axis slider 43 is provided with mounting head 44. Head driving mechanism 40 drives mounting head 44 in a horizontal direction, that is, in the X-axis direction and the Y-axis direction.

Nozzle tool 45 is held by mounting head 44. Nozzle tool 45 has one or multiple suction nozzles 46. Suction nozzle 46, which is an example of a component mounting tool, picks up and collects the component using a negative pressure. Mounting head 44, nozzle tool 45, and suction nozzle 46 can be replaced by a manual operation or an automatic replacement function. Board camera 47 is provided on mounting head 44 alongside nozzle tool 45. Board camera 47 captures an image of a position reference mark attached to board K, and detects an accurate mounting implementation position of positioned board K.

Component transfer device 4 sucks the component from supply position 33 of feeder device 3 using suction nozzle 46, and mounts the component at a designated coordinate position of positioned board K. One set of a pickup operation and a mounting operation is referred to as a pick-up and place cycle (hereinafter, called a PP cycle). Component transfer device 4 can mount a large number of components by repeatedly executing the PP cycle. Mounting accuracy of a component represents the magnitude of an error between a coordinate position designated for the component and an actually mounted coordinate position.

Part camera 5 is provided upwardly on the upper surface of machine stand 10 between board conveyance device 2 and feeder device 3. Part camera 5 captures an image of a state of the component picked up by suction nozzle 46 while mounting head 44 moves from feeder device 3 onto board K. Control device 6 is assembled to machine stand 10, and the arrangement position of control device 6 is not particularly limited. Control device 6 is a computer device which has a CPU and operates by software. Control device 6 controls a mounting work in accordance with mounting sequence 62 stored in memory 61 in advance.

2. Control Function Section Related to Thermal Correction Process of Control Device 6

Figure 2:
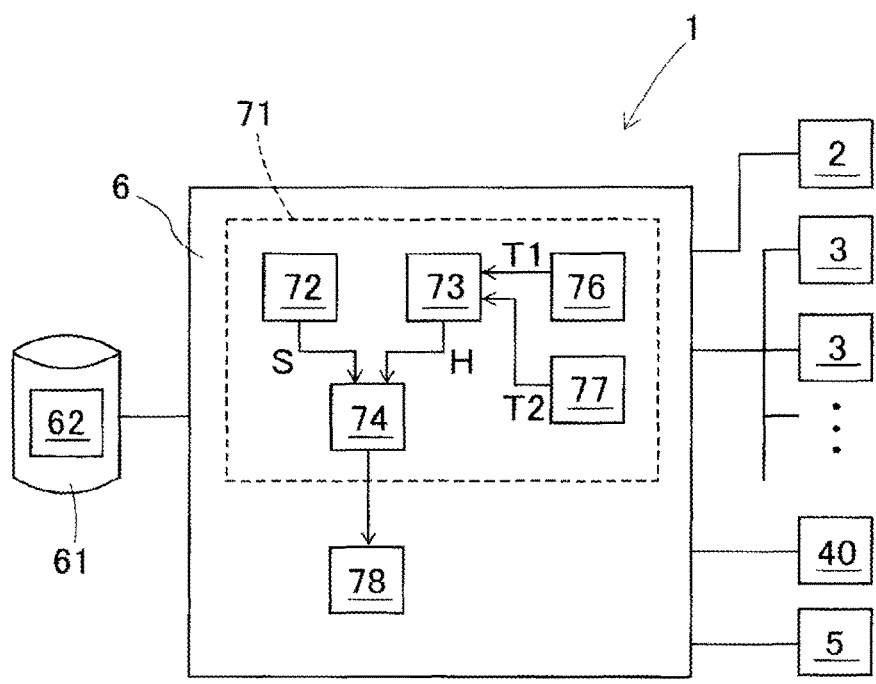
FIG. 2 is a block diagram illustrating a functional configuration related to a thermal correction process of a control device.

Further, control device 6 performs control related to implementation of the thermal correction process. FIG. 2 is a block diagram illustrating a functional configuration related to the thermal correction process of control device 6. Control device 6 includes implementation timing determination section 71 and thermal correction implementation section 78. Implementation timing determination section 71 determines an implementation timing of the thermal correction process based on the required level of the mounting accuracy. Thermal correction implementation section 78 executes the thermal correction process in accordance with the determination result of implementation timing determination section 71.

Here, the contents of the thermal correction process implemented by thermal correction implementation section 78 will be described. When component transfer device 4 is operated, frictional heat is generated by friction between constituting members. Further, electrical heat loss occurs in the driving motor. Due to the heat generation, the temperatures of head driving mechanism 40 and mounting head increase, and head driving mechanism 40 and mounting head 44 are thermally deformed. Due to the thermal deformation, when the component is mounted, an error occurs in the coordinate position, and the mounting accuracy of the component is lowered.

The thermal correction process is implemented to reduce an influence on the mounting accuracy of the component, of which influence being caused by the thermal deformation due to a temperature change in at least one of head driving mechanism 40 and mounting head 44. In the thermal correction process, for example, mounting head 44 moves to the upper side of part camera 5, mounting head 44 is imaged by part camera 5, so that a control error of the position of mounting head 44 is obtained. Further, for example, mounting head 44 moves to the upper side of a position reference mark that is not illustrated on machine stand 10, and the position reference mark is imaged by board camera 47, so that a control error of the position of mounting head 44 is obtained. Accordingly, the X-Y coordinate system used in head driving mechanism 40 can be calibrated to obtain high mounting accuracy.

For example, a technique in Japanese Patent No. 4418014, which is patented to the applicant of the present application, may be employed as a specific method of the thermal correction process. This patent discloses a calibration method when mounting head 44 is replaced, and can also be applied to a thermal correction process that suppresses influence of thermal deformation. In the disclosed thermal correction process, origin correction and pitch correction of the X-Y coordinate system serving as a reference of head driving mechanism 40, correction of a separation distance between nozzle tool 45 and board camera 47, and the like are performed. The pitch correction is to correct a conversion relationship between a rotation amount of the driving motor and a movement amount of mounting head 44.

Implementation timing determination section 71 includes accuracy requirement acquisition section 72, thermal influence acquisition section 73, and level comparison section 74. Accuracy requirement acquisition section 72 acquires accuracy requirement level S indicating a level of the required mounting accuracy. Thermal influence acquisition section 73 acquires thermal influence level H indicating a degree of the influence of the thermal deformation on the mounting accuracy. In the first embodiment, thermal influence acquisition section 73 uses work continuation time timer 76 configured to measure work continuation time T1 of a mounting work and work interruption time timer 77 configured to measure work interruption time T2. Level comparison section 74 compares accuracy requirement level S with thermal influence level H to determine the implementation timing of the thermal correction process. A detailed function of implementation timing determination section 71 will be described in detail in description of an operation.

Figure 3:
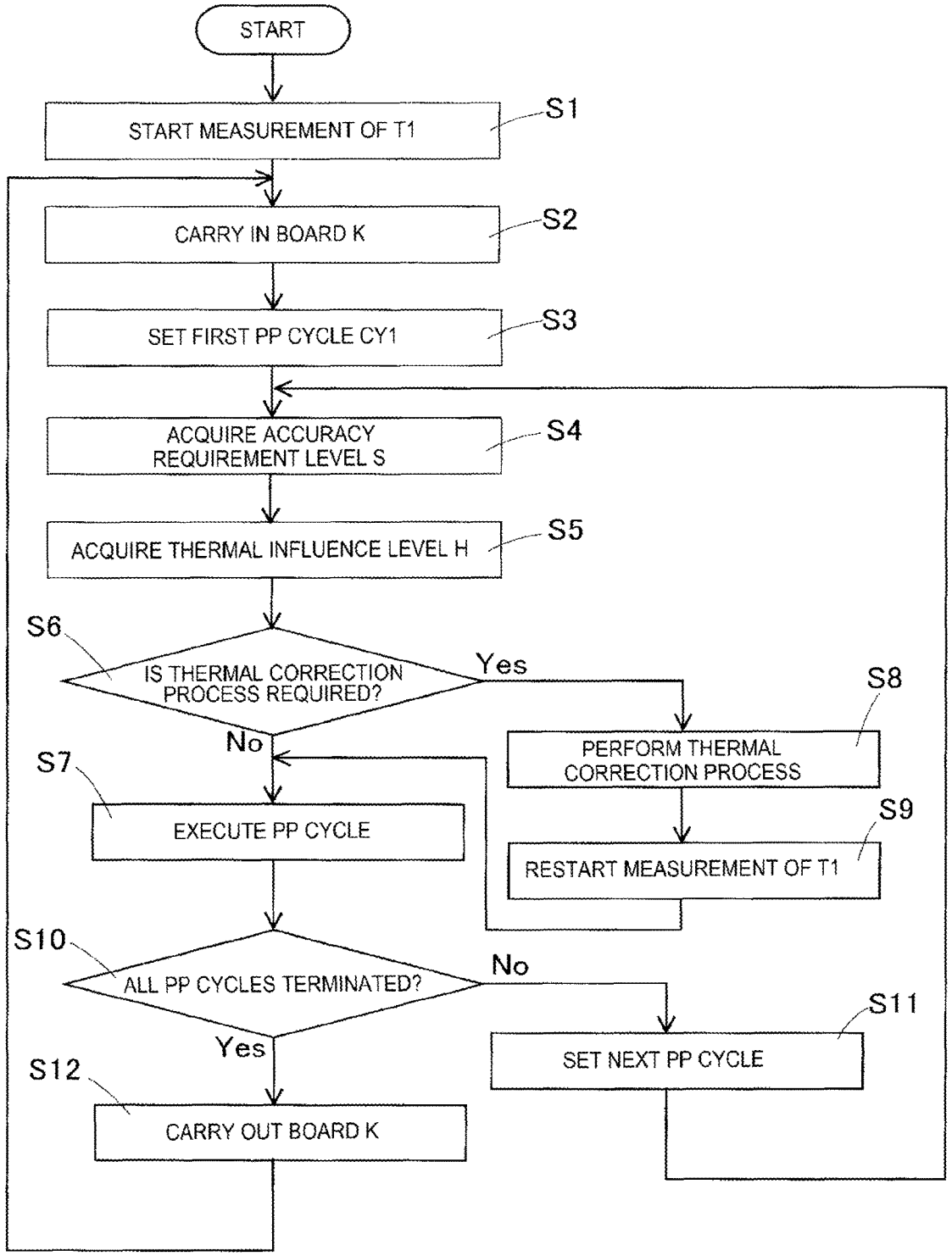
FIG. 3 is a diagram of a process flow of the control device configured to control a mounting work and the thermal correction process.

3. Operation, Action, and Effect of Component Mounting Machine 1 of the First Embodiment Next, the operation, the action, and the effect of component mounting machine 1 of the first embodiment will be described. FIG. 3 is a diagram of a process flow of control device 6 configured to control the mounting work and the thermal correction process. Thereafter, a case where component transfer device 4 has four suction nozzles 46 and the mounting work for one board K is terminated in three PP cycles will be described. When component mounting machine 1 starts to operate, in step S1, thermal influence acquisition section 73 starts work continuation time timer 76, and starts the measurement of work continuation time T1. In next step S2, control device 6 carries in board K. In next step S3, control device 6 sets first PP cycle Cy1 as contents of the mounting work.

Figures 4, 5:
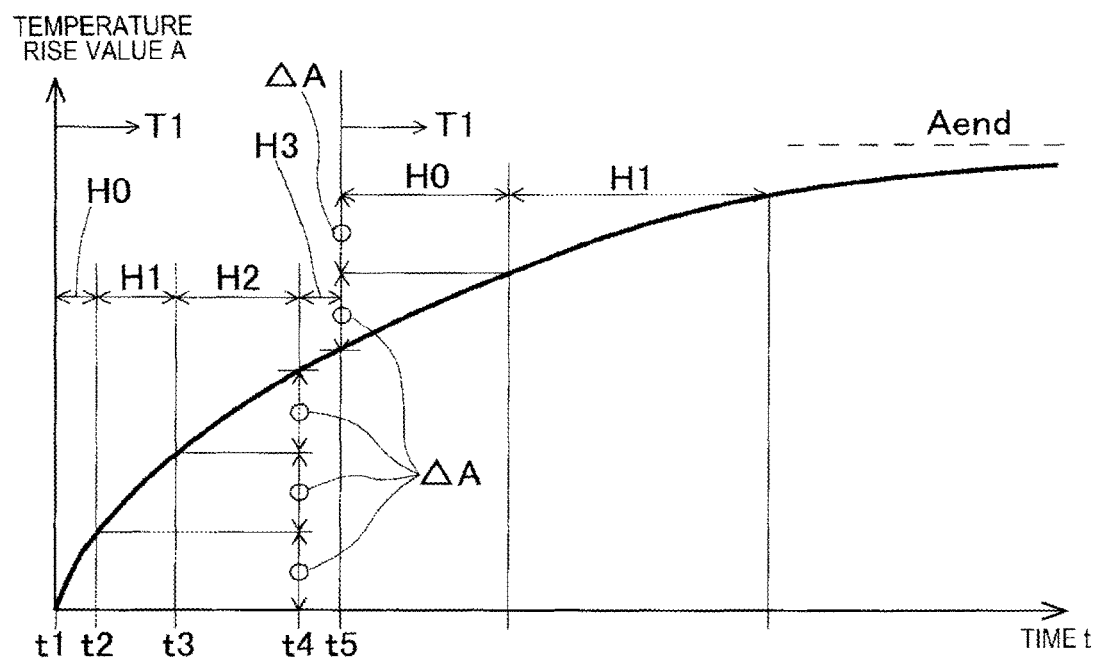
FIG. 4 is a diagram for illustrating a function of an accuracy requirement acquisition section.
FIG. 5 is a diagram of a temperature rise characteristic for illustrating a function of a thermal influence acquisition section.

In next step S4, accuracy requirement acquisition section 72 acquires accuracy requirement level S set in advance for each type of components from mounting sequence 62. For example, three levels of high level SH in which tolerance of the mounted coordinate position is small, middle level SM in which the tolerance is medium, and low level SL in which the tolerance is large can be used as accuracy requirement level S. FIG. 4 is a diagram for illustrating a function of accuracy requirement acquisition section 72.

In first PP cycle Cy1 illustrated in FIG. 4, three PA components and one PB component are mounted. Accuracy requirement level S of the PA components is set to low level SL, and accuracy requirement level S of the PB component is set to high level SH. As described above, when accuracy requirement levels S of multiple components in the PP cycle are different from each other, accuracy requirement acquisition section 72 sets accuracy requirement level S of the highest component as accuracy requirement level S of the PP cycle. Therefore, accuracy requirement level S of first PP cycle Cy1 becomes high level SH.

Further, in second PP cycle Cy2, two PA components having low level SL, one PC component having low level SL, and one PD component having middle level SM are mounted. Therefore, accuracy requirement level S of second PP cycle Cy2 is middle level SM. Further, in third PP cycle Cy3, two PA components having low level SL and two PC components having low level SL are mounted. Therefore, accuracy requirement level S of third PP cycle Cy3 becomes low level SL.

Accuracy requirement acquisition section 72 may acquire, from mounting sequence 62, accuracy requirement level S set in advance for each type of board K. In this case, accuracy requirement level S is not changed until the type of board K to be produced is changed. Further, accuracy requirement acquisition section 72 may acquire, from mounting sequence 62, the coordinate positions and the sizes of multiple components, calculate a separation distance between the multiple components, and set accuracy requirement level S to a higher level as the separation distance is smaller. In this case, accuracy requirement level S becomes high in a region on board K in which mounting density of the components is high, and accuracy requirement level S becomes low in a region on board K where the mounting density is low. Further, similar to an example of FIG. 4, accuracy requirement level S may change every PP cycle. Further, accuracy requirement acquisition section 72 may set accuracy requirement level S in accordance with a predetermined setting of an operator.

In next step S5, thermal influence acquisition section 73 acquires thermal influence level H. In detail, thermal influence acquisition section 73 acquires work continuation time T1 measured by work continuation time timer 76 and work interruption time T2 measured by work interruption time timer 77, to determine thermal influence level H by internal calculation. For example, four levels of non-influence level H0 in which there is little influence of the thermal deformation, small influence level H1, middle influence level H2, and large influence level H3 in which the thermal correction process is required regardless of accuracy requirement level S can be used as thermal influence level H. FIG. 5 is a diagram of a temperature rise characteristic for illustrating a function of thermal influence acquisition section 73.

FIG. 5 schematically illustrates temperature rise characteristics of head driving mechanism 40 and mounting head 44. In FIG. 5, the horizontal axis represents the time t, and the vertical axis represents a temperature rise value A. Component mounting machine 1 starts operating at time t1 and continues the operating. As illustrated, after the start of the operation, temperature rise value A increases with a steep slope. As an operation time becomes longer, the slope of the temperature rise gradually becomes gentle, indicates a saturation tendency, and finally reaches stable temperature rise value A end. In general, when a calorific value and a heat dissipation condition are constant, the temperature rise characteristic can be expressed by a mathematical expression using a thermal time constant. Therefore, thermal influence acquisition section 73 can determine the temperature rise characteristic illustrated in FIG. 5 by the internal calculation using work continuation time T1. Further, the temperature rise characteristic can also be experimentally obtained.

Here, the magnitude of the thermal deformation of head driving mechanism 40 and mounting head 44 is substantially proportional to the magnitude of the temperature change amount. Therefore, qualitatively, thermal influence acquisition section 73 sets thermal influence level H to be larger as work continuation time T1 from time t1 at which the mounting work is started becomes longer. For simple description, thermal influence acquisition section 73 increases thermal influence level H by one for each constant temperature change amount AA. Accordingly, thermal influence acquisition section 73 sets non-influence level H0 from time t1 to time t2. Similarly, thermal influence acquisition section 73 sets small influence level H1 from time t2 to time t3, sets middle influence level H2 from time t3 to time t4, and sets large influence level H3 after time t4.

Since the thermal correction process is unconditionally required at large influence level H3, thermal correction process is performed at time t5. Then, since the influence of the thermal deformation is eliminated, thermal influence acquisition section 73 sets non-influence level H0 after time t5. Thereafter, thermal influence acquisition section 73 increases thermal influence level H one by one as work continuation time T1 from time t5 at which the thermal correction process is terminated increases. However, since the temperature rise tends to be saturated, a continuation time of second non-influence level H0 or small influence level H1 becomes longer than first non-influence level H0 immediately after the start of the operation.

Further, as will be described later, when accuracy requirement level S is middle level SM, the thermal correction process is performed at a point in time when thermal influence level H increases to middle influence level H2. In this case, a time period of large influence level H3 does not occur. Further, in a case where accuracy requirement level S is high level SH, the thermal correction process is performed at a point in time when thermal influence level H increases to small influence level H1. In this case, a time period of middle influence level H2 and large influence level H3 does not occur.

In some cases, the mounting work is interrupted for some reasons, and the process flow is temporarily stopped. In this case, the temperatures of head driving mechanism 40 and mounting head 44 are lowered, and influence of the thermal deformation acts in an opposite direction. Although omitted in FIGS. 3 and 5, when the mounting work is interrupted, thermal influence acquisition section 73 starts work interruption time timer 77, and starts measurement of work interruption time T2. Similar to the temperature rise characteristic, a temperature drop characteristic can be expressed by an equation using a thermal time constant. Therefore, thermal influence acquisition section 73 can appropriately set thermal influence level H by internal calculation based on work continuation time T1 and work interruption time T2.

In next step S6, level comparison section 74 determines the implementation timing of the thermal correction process. Qualitatively, level comparison section 74 determines the implementation timing of the thermal correction process at a point in time at which thermal influence level H is small when accuracy requirement level S is high. Further, level comparison section 74 determines the implementation timing of the thermal correction process at a point in time at which thermal influence level H becomes large when accuracy requirement level S is low. In detail, level comparison section 74 determines the implementation timing of the thermal correction process, based on FIG. 6.

Figures 6, 7:
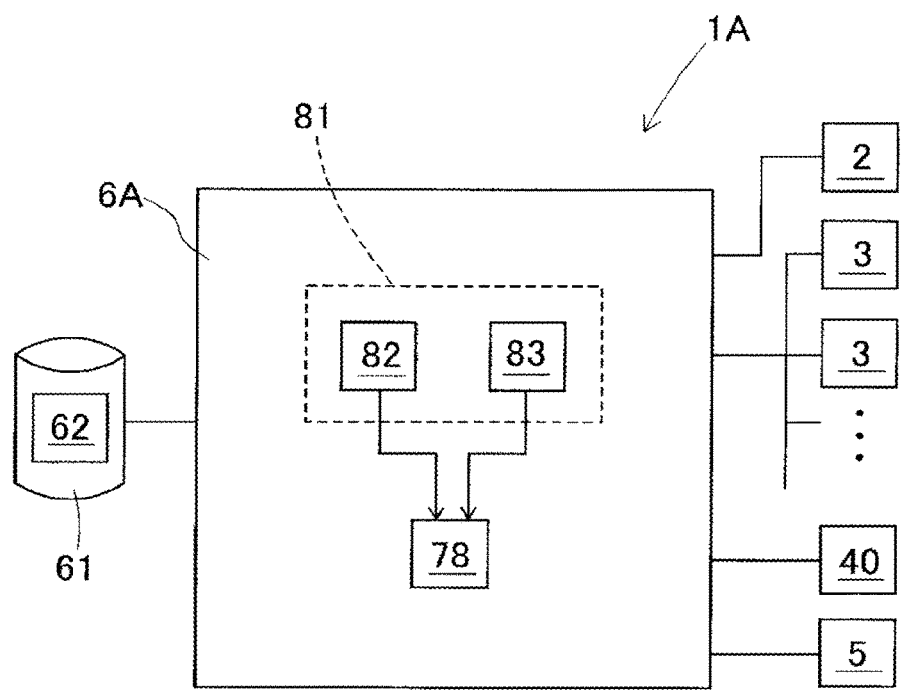
FIG. 6 is a diagram of a determination logic table for illustrating a function of a level comparison section.
FIG. 7 is a block diagram illustrating a functional configuration related to a thermal correction process of a control device according to a second embodiment.

FIG. 6 is a diagram of a determination logic table for illustrating a function of level comparison section 74. FIG. 6 illustrates each level of accuracy requirement level S and each level of thermal influence level H. Then, in each column where both levels intersect, a mark "0" or a mark "x" is displayed. The mark "0" means that the mounting work can continue, and the mark "x" means that the thermal correction process is implemented.

When accuracy requirement level S is low level SL, the mounting work is continued to middle influence level H2 of thermal influence level H, and the thermal correction process is performed after large influence level H3 is reached. Further, when accuracy requirement level S is middle level SM, the mounting work is continued until small influence level H1, and the thermal correction process is performed after middle influence level H2 is reached. Further, when accuracy requirement level S is high level SH, only the mounting work is performed at non-influence level H0, and the thermal correction process is performed at small influence level H1.

When it is determined in step S6 that it is not in the implementation timing of the thermal correction process, the process flow proceeds to step S7. Further, when it is in the implementation timing, the process flow branches to step S8. In step S7, control device 6 can execute the PP cycle under a condition in which the influence of the thermal deformation does not affect the mounting accuracy.

On the other hand, in branched step S8, thermal correction implementation section 78 implements the thermal correction process. Therefore, thermal correction implementation section 78 implements the thermal correction process at an interval between the PP cycles, in other words, in a time period between the mounting operation and a next pickup operation of suction nozzle 46. In next step S9, thermal correction implementation section 78 resets and restarts work continuation time timer 76, and restarts the measurement of work continuation time T1. After step S9, the process flow is merged into step S7. Accordingly, control device 6 can execute the PP cycle under a condition of non-influence level H0 in which the influence of the thermal deformation is remarkably reduced.

In step S10 following step S7, control device 6 determines whether all the PP cycles have been terminated. When it is not the case, in step S11, control device 6 sets a next PP cycle, and returns the execution of the process flow to step S4. When all the PP cycles have been terminated, in step S12, control device 6 carries out board K and returns the execution of the process flow to step S2. Thereafter, control device 6 repeats the mounting work on next board K.

In component mounting machine 1 of the first embodiment, implementation timing determination section 71 determines the implementation timing of the thermal correction process based on the required level of the mounting accuracy, and thermal correction implementation section 78 performs the thermal correction process according to the determination result. Accordingly, a degree of influence of the allowable thermal deformation is considered based on the required level of the mounting accuracy, so that the implementation timing of the thermal correction process is optimized. Therefore, sufficient mounting accuracy that is sufficient for the required mounting accuracy can be obtained. Further, the number of times of implementations of the thermal correction process is minimized, so that high production efficiency can be achieved.

4. Component Mounting Machine 1A of Second Embodiment

Next, in component mounting machine 1A of the second embodiment, points different from the first embodiment will be mainly described. Component mounting machine 1A of the second embodiment has the same configuration as that of the first embodiment, and a control function section of control device 6A differs from that of the first embodiment. FIG. 7 is a block diagram illustrating a functional configuration of the thermal correction process of control device 6A of the second embodiment. Control device 6A includes implementation timing determination section 81 and thermal correction implementation section 78. The function of thermal correction implementation section 78 is the same as that of the first embodiment.

Implementation timing determination section 81 includes multiple mounting determination section 82 and change timing determination section 83. When a multiple mounting work with particularly high required mounting accuracy is performed, multiple mounting determination section 82 determines that it is the implementation timing of the thermal correction process. Change timing determination section 83 determines that a change timing at which an implementation state of the mounting work is changed is the implementation timing of the thermal correction process. Implementation timing determination section 81 may include only one of multiple mounting determination section 82 and change timing determination section 83.

Figure 8:
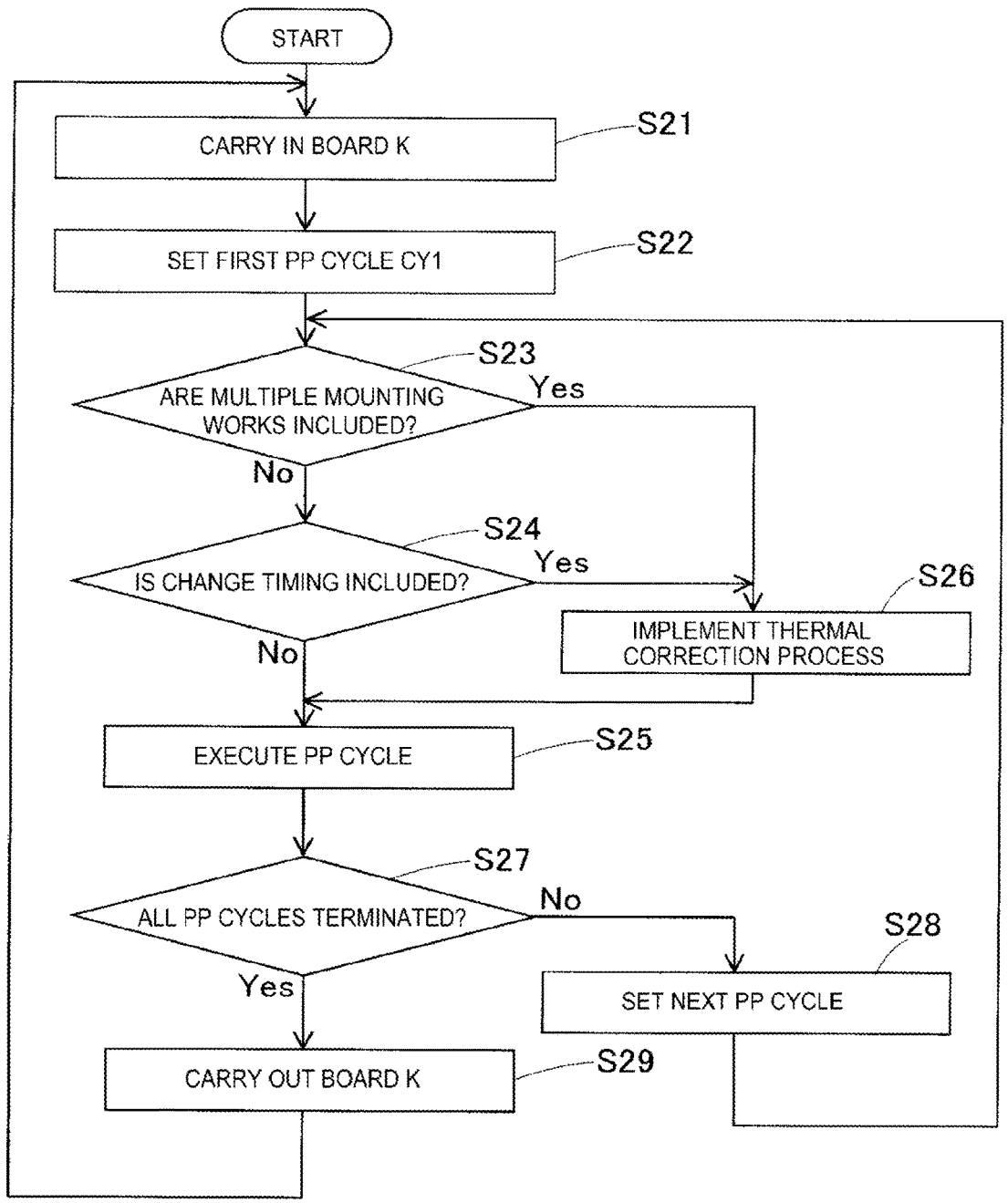
FIG. 8 is a diagram of a process flow of the control device according to the second embodiment.

FIG. 8 is a diagram of a process flow of control device 6A according to the second embodiment. When component mounting machine 1A starts operating, control device 6A carries in board K in step S21. In next step S22, control device 6A sets first PP cycle Cy1 as contents of the mounting work. In next step S23, multiple mounting determination section 82 determines whether multiple mounting works are included in a current PP cycle. In the multiple mounting works, the required mounting accuracy is particularly high. Therefore, in the process flow of the second embodiment, the thermal correction process is performed immediately before the PP cycle including the multiple mounting works is performed.

Examples of the multiple mounting works include a work of mounting a small second component on the upper surface of a large first component and a work of mounting a shield component to cover a component susceptible to electromagnetic fields. Multiple mounting determination section 82 branches execution of the process flow to step S26 when the multiple mounting works are included, and causes the execution of the process flow to proceed to step S24 when the multiple mounting works are not included. In step S24, change timing determination section 83 determines whether the change timing is included in the current PP cycle.

As a first example of the change timing, there is an exchange timing for exchanging at least one of mounting head 44, nozzle tool 45, and suction nozzle 46 before the execution of the PP cycle. When these tools are replaced, the mounting accuracy may be discontinuously reduced due to individual differences in the tools, subtle reproduction errors of attachment states, and the like. Further, as a second example of the change timing, there is a tuning when board K is a multiple pattern board of multiple small piece hoards, and a small piece that is a target for the mounting work of the PP cycle is switched. Also in this case, the mounting accuracy may be discontinuously reduced due to an error of a local coordinate system of the small piece board or the like. Therefore, in the process flow of the second embodiment, the thermal correction process is performed at the change timing.

Change timing determination section 83 branches the execution of the process flow to step S26 when the change timing is included, and causes the execution of the process flow to proceed to step S25 when the change timing is not included. In step S25, control device 6 can execute the PP cycle under a condition in which the mounting accuracy is not affected by the influence of the thermal deformation.

On the other hand, in branched step S26, thermal correction implementation section 78 implements the thermal correction process. That is, thermal correction implementation section 78 implements the thermal correction process immediately before the multiple mounting works, immediately after a new tool is attached, or immediately after a target small piece board is switched. After step S26, the process flow is merged into step S25. Accordingly, in non-influence level H0 in which the influence of the thermal deformation is significantly reduced, control device 6A can execute the PP cycle.

In step S27 following step S25, control device 6A determines whether all the PP cycles have been terminated. When all the PP cycles are not terminated, in step S28, control device 6A sets a next PP cycle and returns the execution of the process flow to step S23. In step S29 when all the PP cycles have been terminated, control device 6A carries out board K, and returns the execution of the process flow to step S21. Thereafter, control device 6A repeats the mounting work onto next board K.

In component mounting machine 1A of the second embodiment, implementation timing determination section 81 determines the implementation timing of the thermal correction process in consideration of the presence or absence of the multiple mounting works and the change timing in which the implementation state of the mounting work is changed, and thermal correction implementation section 78 implements the thermal correction process according to the determination result. Accordingly, the thermal correction process is implemented as needed in consideration of the multiple mounting works that require particularly high mounting accuracy, and the risk of discontinuous deterioration of the mounting accuracy due to an implementation state change of the mounting work. Therefore, sufficient mounting accuracy that is sufficient for the required mounting accuracy can be obtained. Further, the number of times of implementations of the thermal correction process is minimized, so that high production efficiency can be achieved.

5. Component Mounting Machine 1B of the Third Embodiment

Figure 9:
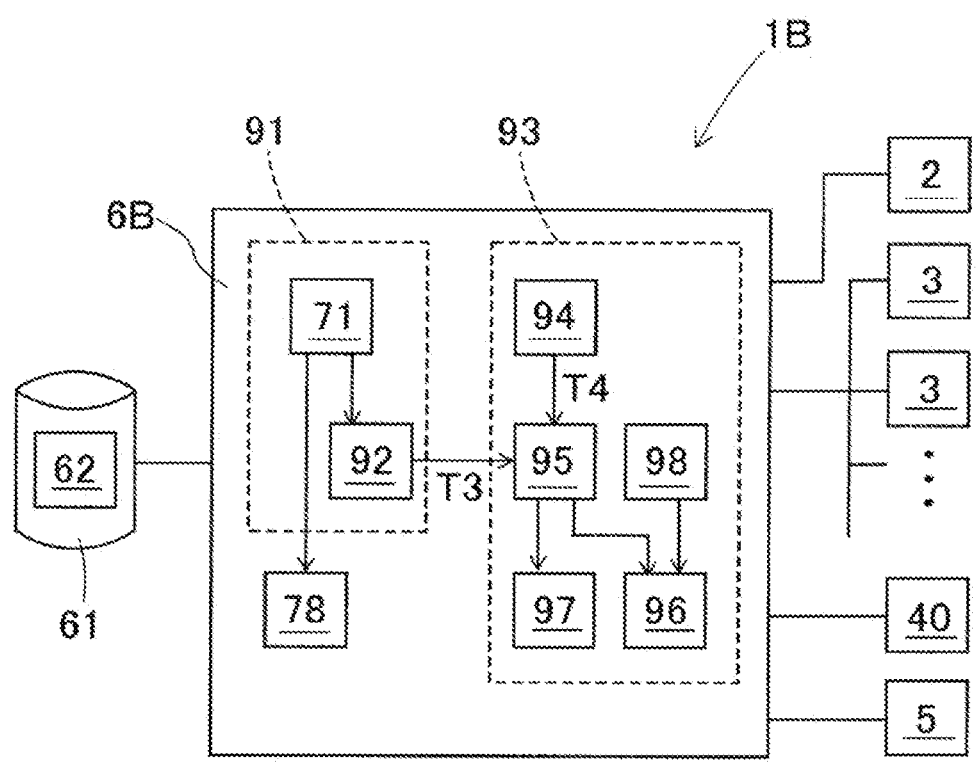
FIG. 9 is a block diagram illustrating a functional configuration related to a thermal correction process and a measurement process of a control device according to a third embodiment.

Next, a difference between component mounting machine 1B of the third embodiment and that of the first and second embodiments will be mainly described. Component mounting machine 1B of the third embodiment has the same configuration as that of the first embodiment, and a control function section of control device 6B differs from that of the first and second embodiments. FIG. 9 is a block diagram illustrating a functional configuration related to the thermal correction process and a measurement process of control device 6B according to the third embodiment. Control device 6B has implementation timing determination section 91 and thermal correction implementation section 78 as control function sections related to the thermal correction process. Control device 6B further includes accuracy management section 93.

The accuracy management section 93 controls execution of the measurement process related to management of the mounting accuracy. A post-mounting measurement process (Place And Measure process, hereinafter, referred to as a PAM process) that identifies the mounting accuracy by actually measuring the coordinate positions of the mounted component can be exemplified as the measurement process. The actual measurement of the coordinate position is automatically performed by imaging the mounted component using head driving mechanism 40 and board camera 47.

The PAM process is periodically performed, for example, when the mounting work of the first board K in lot production is terminated or whenever the mounting work of a certain number of boards K is terminated. The PAM process may also be performed temporarily in accordance with an instruction from the operator. A result of the measurement process is used to calibrate the X-Y coordinate system used in head driving mechanism 40. The measurement process, which is a process in which the operator participates, may be implemented with support of accuracy management section 93. Further, accuracy management section 93 can also control execution of measurement process other than the PAM process, for example, an automatic calibration process. In the automatic calibration process, whether suction nozzle 46 is obliquely attached or an attachment height is identified.

It is preferable that accuracy management section 93 implements the measurement process as much as possible under a condition of non-influence level H0 in which the influence of the thermal deformation is significantly reduced. Further, it should be avoided that the thermal correction process starts while accuracy management section 93 controls the measurement process. Otherwise, measurement accuracy in the measurement process is greatly reduced. Control device 6B of the third embodiment is functionally configured to suppress a decrease in the measurement accuracy in the measurement process, and will be described below.

Implementation timing determination section 91 includes the function of implementation timing determination section 71 of the first embodiment. Implementation timing determination section 91 further includes margin time calculation section 92. Margin time calculation section 92 calculates margin time T3 until a time when the next thermal correction process is to be performed. Margin time calculation section 92 can calculate margin time T3 by predicting the implementation timing of the next thermal correction process by the internal calculation based on the temperature rise characteristic and the temperature drop characteristics described above. The function of thermal correction implementation section 78 is the same as that of the first embodiment. Accuracy management section 93 includes required time calculation section 94, implementation determination section 95, measurement implementation section 96, warming operation implementation section 97, and emergency measurement implementation section 98. Detailed functions of accuracy management section 93 will be described in detail in description of the operation.

Figure 10:
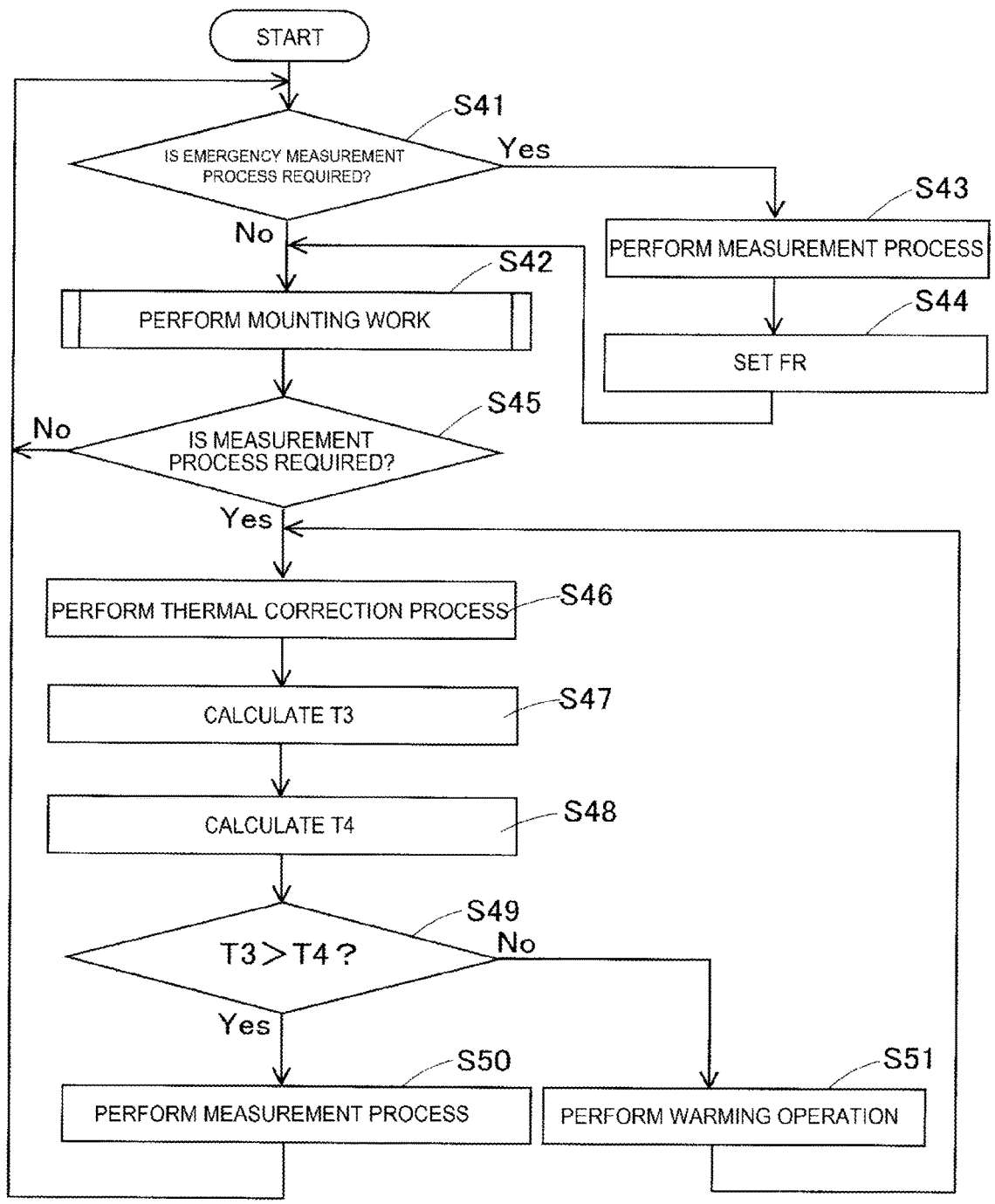
FIG. 10 is a diagram of a process flow of the control device according to the third embodiment.

FIG. 10 is a diagram of a process flow of control device 6B according to the third embodiment. When component mounting machine 1B starts operating, emergency measurement implementation section 98 determines whether an emergency measurement process is needed, in step S41. The emergency measurement process is implemented when an urgent event occurs, for example, when a failure or an abnormality occurs and a recovery work is thus performed. In this case, it is important to quickly implement the measurement process and restart the operation. When the emergency measurement process is not required, control device 6B causes the process flow to proceed to step S42, and implements the mounting work on one board K. Details of the mounting work conform to the process flow of the first embodiment illustrated in FIG. 3.

When the emergency measurement process is needed, emergency measurement implementation section 98 branches the execution of the process flow to step S43, and starts measurement implementation section 96 regardless of a length relationship between required time T4 and margin time T3. Measurement implementation section 96 implements emergency measurement process. However, since the thermal correction process is not implemented in a recent time, the actually measured measurement accuracy is not always guaranteed. In addition, the mounting accuracy of components secured by the measurement process is not guaranteed.

Therefore, in next step S44, emergency measurement implementation section 98 sets accuracy recovery flag FR. Accuracy recovery flag FR is a flag requiring that the measurement process is performed again under a condition of non-influence level H0 to recover the measurement accuracy. After step S44, the process flow is merged into step S42. Accordingly, component mounting machine 1B can quickly restart the operation by implementing the mounting work.

In step S45 subsequent to step S42, implementation determination section 95 determines whether there is requirement to implement the measurement process. When the following Cases 1)-4) are not applied, implementation determination section 95 determines that there is no requirement, and returns the execution of the process flow to step S41. When any one of Cases 1) to 4) is applied, implementation determination section 95 determines that there is requirement and causes the execution of the process flow to proceed to step S46.

Case 1) When the mounting work of first board K in the lot production is terminated.

Case 2) When the mounting work of a predetermined number of boards K is terminated after a previous measurement process.
Case 3) When accuracy recovery flag FR is set.
Case 4) When the instruction to implement the measurement process is received from the operator.

In step S46, thermal correction implementation section 78 implements the thermal correction process. In next step S47, margin time calculation section 92 calculates above-described margin time T3. In next step S48, required time calculation section 94 calculates required time T4 required for the measurement process. In next step S49, implementation determination section 95 determines the magnitude relationship between required time T4 and margin time T3, and selectively starts measurement implementation section 96 or warming operation implementation section 97.

In step S50 when required time T4 is shorter than margin time T3, measurement implementation section 96 is started to implement the measurement process. A result of the measurement process is used to calibrate the X-Y coordinate system used in head driving mechanism 40. In a case corresponding to Case 3), the actually measured measurement accuracy is guaranteed, and the mounting accuracy of the component secured by the measurement process is also guaranteed. After the measurement process is implemented, measurement implementation section 96 resets accuracy recovery flag FR. After step S50, the execution of the process flow returns to step S41.

In step S51 when required time T4 is equal to or longer than margin time T3, warming operation implementation section 97 is started to warm up component transfer device 4. By the determination in step S49, it is possible to prevent the thermal correction process from being performed during the measurement process. Warming operation implementation section 97 drives head driving mechanism 40 without mounting the components to increase the temperature of constituting members. Thereafter, the execution of the process flow returns to step S46. By repeating a process loop including steps S46 to S49 and S51, as an increase in the temperature of the constituting members tends to be saturated, margin time T3 becomes longer. As a result, a condition of step S49 is satisfied, and the warming operation is terminated. Thereafter, the execution of the process flow escapes from the process loop and proceeds to step S50.

According to component mounting machine 1B of the third embodiment, the measurement process is performed under the condition of non-influence level H0 in which the influence of the thermal deformation is remarkably reduced. In addition, the thermal correction process is not performed during the measurement process. Therefore, by calibration using the result of the measurement process, the mounting accuracy of the component is maintained high. Further, at a time of recovery from a failure or abnormality, even when the measurement accuracy is not guaranteed, the emergency measurement process quickly restarts the operation, and thus high production efficiency is maintained.

6. Applications and Modifications of Embodiments

The first, second, and third embodiments can be simultaneously realized by one component mounting machine. Further, although a current process flow is different from the process flow of the first embodiment illustrated in FIG. 3, when accuracy requirement level S is in low level SL, thermal correction implementation section 78 may execute the thermal correction process only during a time period in which board K for which the mounting work is terminated is carried out and next board K is carried in. Accordingly, since a process time of the thermal correction process overlaps a replacement time of board K, no temporal loss occurs, and production efficiency is not reduced.

Further, in the process flow of the third embodiment illustrated in FIG. 3, step S46 may be omitted. Further, when accuracy requirement level S required for the component or board K is high level SH or middle level SM, step S46 may be implemented, and when accuracy requirement level S is low level SL, step S46 may be omitted. Various modifications and applications in addition to the first to third embodiments are possible.

REFERENCE SIGNS LIST 1, 1A, 1B: component mounting machine, 2: board conveyance device, 3: feeder device, 4: component transfer device, 40: head driving mechanism, 44: mounting head, 5: part camera 6: 6A, 6B: control device, 71: implementation timing determination section, 72: accuracy requirement acquisition section, 73: thermal influence acquisition section, 74: level comparison section, 78: thermal correction implementation section, 81: implementation timing determination section, 82: multiple mounting determination section, 83: change timing determination section, 91: implementation timing determination section, 92: margin time calculation section, 93: accuracy management section, 94: required time calculation section, 95: implementation determination section, 96: measurement implementation section, 97: warming operation implementation section, 98: emergency measurement implementation section, K: board, S: accuracy requirement level, SH: high level, SM: middle level, SL: low level, H: thermal influence level, H0: non-influence level, H1: small influence level, H2: middle influence level, H3: large influence level, T1: work continuation time, T2: work interruption time

The invention claimed is:
1. A component mounting machine comprising:
a component transfer device, having a component mounting tool configured to collect and mount a component, a mounting head configured to hold the component mounting tool, and a head driving mechanism configured to horizontally drive the mounting head, which performs a mounting work of mounting the component collected from a component supply device on a predetermined coordinate position of a board carried in and positioned by a board conveyance device, and
a control device including a processor configured to control the mounting work, and configured to implement a thermal correction process for reducing an influence on mounting accuracy of the component, of which the influence being caused by thermal deformation due to a temperature change in at least one of the head driving mechanism and the mounting head,
wherein the control device is configured to:
acquire an accuracy requirement level indicating a required level of the mounting accuracy based on at least one of a type of component to be mounted and the mounting work, the accuracy requirement level being one of low, middle or high,
acquire a thermal influence level indicating a level of the influence of the thermal deformation on the mounting accuracy based on a work continuation time in which the mounting work continues from start of the mounting work to finish of the mounting work or from termination of a previous thermal correction process and to restart the mounting work after the previous thermal correction process to finish the mounting work, and a temperature rise characteristic of at least one of the head driving mechanism and the mounting head, the thermal influence level being one of non-influence, small, middle or large,
determine an implementation timing of the thermal correction process based on the accuracy-requirement level and the thermal influence level, and
implement the thermal correction process according to the determined implementation timing in a time period between a mounting operation and a next picking up operation of the component mounting tool or in a time period between the board conveyance device carrying out the board of which mounting work is terminated and carrying in a next board.

2. The component mounting machine of claim 1, wherein the control device is configured to determine the implementation timing of the thermal correction process at a point in time at which the thermal influence level is small and the accuracy requirement level is high, and
the control device configured to determine the implementation timing of the thermal correction process at a point in time at which the thermal influence level is large and the accuracy requirement level is low.

3. The component mounting machine of claim 1, wherein the control device is configured to acquire a predetermined accuracy requirement level for each type of the board.

4. The component mounting machine of claim 1, wherein the control device is configured to acquire a predetermined, accuracy requirement level for each type of the component.

5. The component mounting machine of claim 1, wherein the control device is configured to determine a separation distance between the multiple components using each coordinate position and each size of the multiple components, and sets the accuracy requirement level based on the separation distance.

6. The component mounting machine of claim 1, wherein the control device is configured to set the thermal influence level to be larger as the work continuation time becomes longer.

7. The component mounting machine of claim 6, wherein the control device is configured to measure a work interruption time from a time when the mounting work is interrupted, and set the thermal influence level based on the work continuation time and the work interruption time.

8. The component mounting machine of claim 1, wherein the control device is configured to determine the implementation timing of the thermal correction process when the accuracy requirement level is high and a multiple mounting work of mounting a second component on an upper side of a first component is performed.

9. The component mounting machine of claim 1, wherein the control device is configured to determine the implementation timing of the thermal correction process while regarding at least one of a timing in which the component mounting tool or the mounting head is replaced and a timing in which the board is a multiple pattern board including multiple small piece boards and the small piece boards that are targets of the mounting work are switched, as the change timing.

10. The component mounting machine of claim 6, wherein
the control device automatically implements a measurement process related to the mounting accuracy or supports a manual measurement process in which an operator participates,
the control device is configured to calculate a margin time until the implementation timing of a next thermal correction process is reached, and
the control device is configured to calculate a required time for the measurement process and to implement or support the measurement process when the required time is shorter than the margin time.

11. The component mounting machine of claim 10, wherein
the control device is configured to warm up the component transfer device without implementing or supporting the measurement process when the required time is equal to or larger than the margin time.

12. The component mounting machine of claim 10, wherein
the control device is configured to implement or support the measurement process regardless of a magnitude relationship between the required time and the margin time in at least one of a case where an urgent event occurs and a case where an instruction from the operator is accepted.

* * * * *